United States Patent
Furutani et al.

(10) Patent No.: US 8,675,422 B2
(45) Date of Patent: Mar. 18, 2014

(54) SEMICONDUCTOR DEVICE

(76) Inventors: Kiyohiro Furutani, Tokyo (JP);
Yoshinori Matsui, Tokyo (JP)

(*) Notice: Subject to any disclaimer, the term of this patent is extended or adjusted under 35 U.S.C. 154(b) by 230 days.

(21) Appl. No.: 13/204,276

(22) Filed: Aug. 5, 2011

(65) Prior Publication Data
US 2012/0033506 A1 Feb. 9, 2012

(30) Foreign Application Priority Data

Aug. 9, 2010 (JP) .................. 2010-178780

(51) Int. Cl.
*G11C 7/06* (2006.01)
(52) U.S. Cl.
USPC ..................................... 365/189.07
(58) Field of Classification Search
USPC ................................... 365/189.07
See application file for complete search history.

(56) References Cited

U.S. PATENT DOCUMENTS

| 6,121,786 | A | * | 9/2000 | Yamagami et al. ........ 324/750.3 |
| 6,744,689 | B2 | | 6/2004 | Itou |
| 2004/0022115 | A1 | * | 2/2004 | Park et al. ..................... 365/226 |
| 2004/0027906 | A1 | | 2/2004 | Itou |

FOREIGN PATENT DOCUMENTS

JP         2004-071095         3/2004

* cited by examiner

*Primary Examiner* — Anthan Tran

(57) ABSTRACT

A semiconductor device includes an internal circuit and an internal voltage generation circuit which generates an internal voltage stabilized with respect to a variation of the power supply voltage supplied from the outside and supplies the internal voltage to the internal circuit. The internal voltage generation circuit performs control so that when the power supply voltage rises to exceed a predetermined value, an operation of stabilizing the internal voltage is stopped to cause the internal voltage to increase with the rise of the power supply voltage.

21 Claims, 10 Drawing Sheets

SEMICONDUCTOR DEVICE

REFERENCE TO RELATED APPLICATION

This application is based upon and claims the benefit of the priority of Japanese patent application No. 2010-178780, filed on Aug. 9, 2010, the disclosure of which is incorporated herein in its entirety by reference thereto. The present invention relates to a semiconductor device. More specifically, the invention relates to a semiconductor device including a constant voltage circuit, an internal circuit which operates on a constant voltage, and an internal circuit which operates on an external power supply voltage. Further, the invention relates to the semiconductor device including a memory cell array, a peripheral circuit which operates on the constant voltage, and a peripheral circuit which operates on the external power supply voltage.

TECHNICAL FIELD

Background

Patent Document 1 describes a semiconductor memory device including a power supply circuit which maintains an internal power supply voltage to be constant even when a power supply voltage supplied from an outside of the semiconductor memory device varies. It is considered that, by using the power supply circuit as described in Patent Document 1 which maintains the stable constant power supply voltage that does not depend on a variation of the power supply voltage supplied from the outside, stable operation of the semiconductor memory device that does not depend on the power supply voltage can be expected.
[Patent Document 1]
JP Patent Kokai Publication No. JP2004-71095A, which corresponds to US Patent Application Publication No. US2004/027906A1 and U.S. Pat. No. 6,744,689B2.

SUMMARY

The following analysis is given by the present invention. Usually, a semiconductor device includes a lot of circuit blocks. Each of these blocks, however, does not operate using an internal voltage as an operating voltage. Some semiconductor devices have a mixture of a circuit block (hereinafter referred to as an internal voltage operation block) which uses an internal voltage as an operating voltage and a circuit block (hereinafter referred to as an external voltage operation block) that operates using a power supply voltage from an outside as an operating voltage in view of an interface with the outside and power consumption. In this case, a signal level from the internal voltage operation block depends on the internal voltage, and is generally constant with respect to a variation of the power supply voltage. In contrast therewith, the operating voltage of the external voltage operation block varies with the variation of the power supply voltage. The more a voltage difference between the internal voltage and the power supply voltage from the outside increases, a malfunction will occur at a portion connecting the external voltage operation block and the internal voltage operation block. Thus there is much desired in the art.

According to a first aspect of the present invention there is provided a semiconductor device which comprises:
an internal circuit; and
an internal voltage generation circuit stabilizing an internal voltage to be supplied to the internal circuit against a variation of a power voltage supplied to the internal voltage generation circuit;
wherein the internal voltage generation circuit stops stabilizing the internal voltage when the power voltage is greater than a predetermined value so that the internal circuit is allowed to be supplied with the internal voltage that is subject to the variation of the power voltage.

According to a second aspect of the present invention there is provided a semiconductor device which comprises:
a plurality of bit lines;
a plurality of word lines intersecting the bit lines;
a plurality of memory cells arranged respectively at intersections between the bit lines and the word lines;
a plurality of sense amplifiers connected respectively to the bit lines;
a plurality of IO lines;
a plurality of column selection switches provided respectively between the bit lines and the IO lines;
a column decoder operating on a power voltage supplied from outside to control the column selection switches such that a selected one of the bit lines is connected to corresponding one of the IO lines; and
a first internal voltage generation circuit stabilizing an first internal voltage to be supplied to the sense amplifiers against a variation of the power voltage;
wherein the first internal voltage generation circuit stops stabilizing the first internal voltage when the power voltage is greater than a predetermined value so that the sense amplifiers are allowed to be supplied with the first internal voltage that is subject to the variation of the power voltage.

The meritorious effects of the present invention are summarized as follows, however, without limitation thereto. According to the present invention, when the power supply voltage supplied from the outside greatly varies, the internal voltage generation circuit performs control so that the stabilizing operation is stopped to cause the resultant voltage to vary following the variation of the power supply voltage supplied from the outside. Thus, occurrence of a malfunction caused by a difference between the power supply voltage provided from the outside and the voltage generated by the internal voltage generation circuit can be avoided. Other features and/or advantageous of the present invention will become apparent from the entire disclosure including claims and drawings.

PREFERRED MODES

In a semiconductor device according to the present invention, internal voltages are stabilized with respect to a variation of a power supply voltage within a predetermined range. In addition, when the power supply voltage varies beyond that range, at least a portion of the internal voltages is varied, following the variation of the power supply voltage.

Accordingly, by using circuits for generating the internal voltages for the semiconductor device having a mixture of an internal voltage operation block and an external voltage operation block, occurrence of a malfunction can be avoided against the variation of the power supply voltage from an outside beyond the predetermined range.

As will be described below, a DRAM that operates by supply of two systems of external power supply voltages VDD1 (1.6V to 2.0V) and VDD2 (1.1V to 1.5V) is illustrated for explanation, as an example of a preferred exemplary embodiment of the present invention. The present invention is not limited to such a configuration of the DRAM, and can be preferably used for a semiconductor memory (such as an SRAM, a PRAM, a flush memory, or the like) other than the DRAM, which is a memory that uses a stabilized internal voltage for a memory cell array portion. Further, the present invention can be applied to a semiconductor device other than the semiconductor memory.

First Exemplary Embodiment (Overall Configuration of Semiconductor Device)

Figure 1:
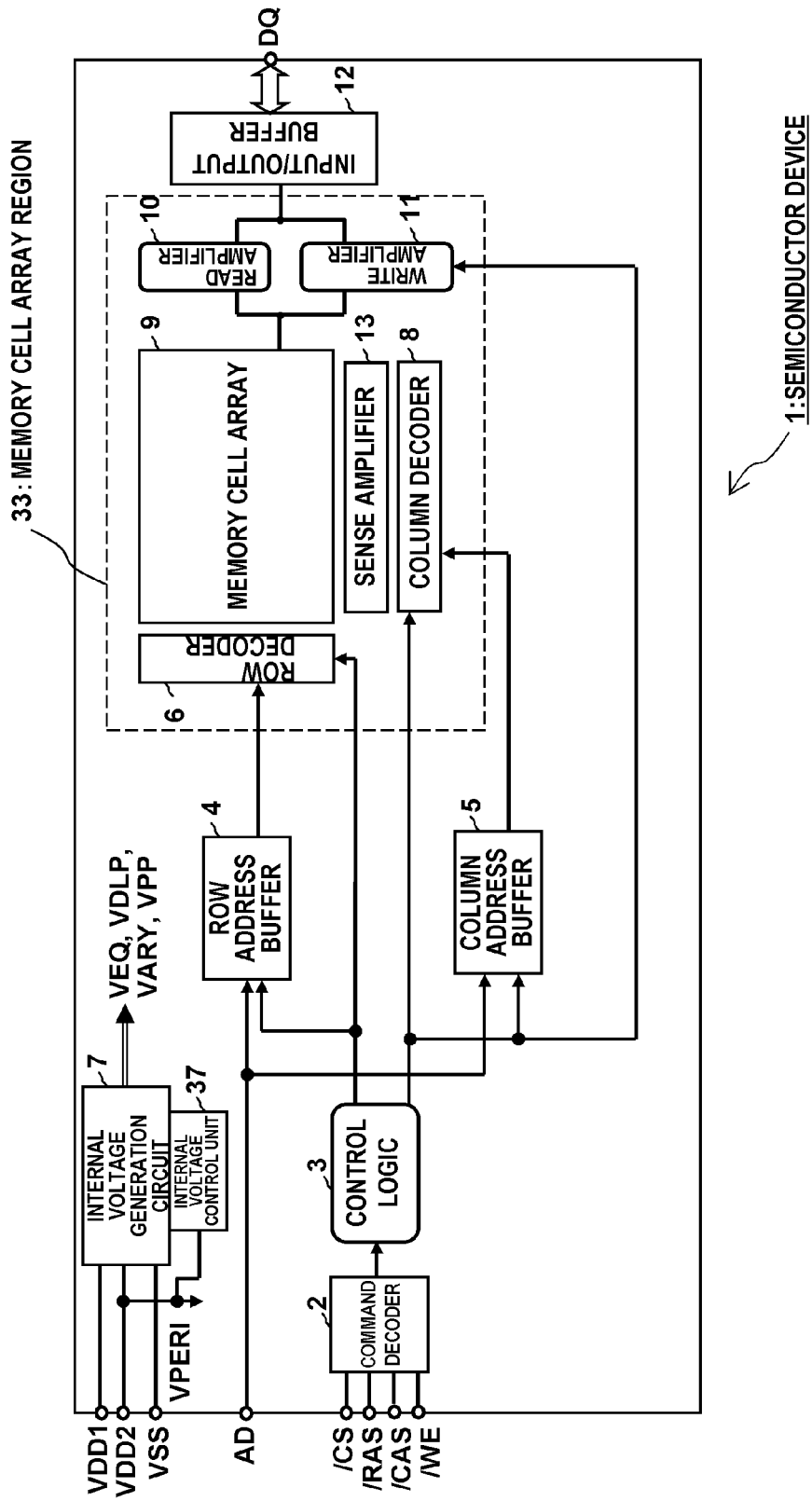
FIG. 1 is a block diagram of an overall semiconductor device in an exemplary embodiment of the present invention.

FIG. 1 is a block diagram of an overall semiconductor device in a first exemplary embodiment. A semiconductor device 1 includes power supply terminals VDD1, VDD2, and VSS. The semiconductor device 1 includes an address input terminal AD, command input terminals such as /CS, /RAS, /CAS, and /WE, and further a data input/output terminal DQ. In addition to those terminals, an external terminal such as a clock terminal is provided for the semiconductor device 1, of which illustration is omitted. The symbol "/" at the beginning of a terminal name such as the /CS terminal indicates the name of a terminal which is active low. The address input terminal AD is a terminal of a plurality of bits for receiving address signals of the plurality of bits in parallel. The data input/output terminal DQ may also be a terminal of a plurality of bits on the order of four to 64 bits, for receiving and outputting data in parallel.

The command input terminals /CS, /RAS, /CAS, /WE of the external terminals described above are connected to a command decoder 2. The command decoder 2 decodes a command signal supplied to the semiconductor device 1 from an outside, thereby determining the operation mode of the semiconductor device 1. A control logic 3 generates various control signals for controlling operation of each block in the semiconductor device 1, based on a command decoded by the command decoder 2.

A row address of the address signals received through the address input terminal AD is captured by a row address buffer 4 and a column address of the address signals is captured by a column address buffer 5, based on the control signals output by the control logic 3.

A memory cell array 9 is disposed in a memory cell array region 33. In the memory cell array 9, a plurality of memory cells each for storing data are arranged in the form of a matrix. Though no particular limitation is imposed, preferably, the memory cell array 9 in the semiconductor device 1 in FIG. 1 is a DRAM memory cell array in which DRAM memory cells are arranged. In addition to the memory cell array 9, a row decoder 6, a column decoder 8, a read amplifier 10, a write driver 11, and sense amplifiers 13 are disposed in the memory cell array region 33, as circuits for controlling access to a memory cell within the memory cell array 9.

The row address captured by the row address buffer 4 is connected to the row decoder 6. The column address captured by the column address buffer 5 is connected to the column decoder 8. When a read/write access is made, the row address is decoded by the row decoder 6 and the column address is decoded by the column decoder 8 to specify the memory cell in the memory cell array 9, based on the control signals supplied from the control logic 3.

When a data read from the memory cell array 9 is executed, data in the memory cell at the row address specified by the row decoder is amplified by a corresponding one of the sense amplifiers 13, and further, the column address is selected by the column decoder. The data is thereby read to an outside of the memory cell array 9. The data read to the outside of the memory cell array 9 is further amplified by the read amplifier 10 and is then transferred to an input/output buffer 12. Then, the data is output to the outside of the semiconductor device 1 from the input/output buffer 12 through the data input/output terminal DQ.

When a data write to the memory cell array 9 is executed, data supplied to the data input/output terminal DQ from the outside of the semiconductor device 1 is captured by the input/output buffer 12. The amplitude of the data captured by the input/output buffer 12 is amplified by the write driver 11, and the data is then sent to the sense amplifier 13 corresponding to the selected column address. The data is further amplified by the sense amplifier 13, and the data is written to the memory cell in the memory cell array 9 at the address selected by the row decoder 6.

The semiconductor device 1 further includes the power supply terminals VDD1, VDD2, and VSS. Usually, a power supply of 1.8V is provided to the power supply terminal VDD1, a power supply of 1.2V is provided to the power supply terminal VDD2, and a power supply of 0V is provided to the power supply terminal VSS. Each of the power supply terminals VDD1, VDD2, and VSS is connected to an internal voltage generation circuit 7.

The internal voltage generation circuit 7 is a circuit which generates various internal voltages necessary for internal circuits of the semiconductor device 1, based on voltages given from the power supply terminals VDD1, VDD2, and VSS. The internal voltages output by the internal voltage generation circuit 7 are voltages which are stabilized so that even when the power supply voltage supplied from the power supply terminal VDD1 or VDD2 has varied, the voltages may be maintained to be constant, as a basic operation.

Among the internal voltages generated by the internal voltage generation circuit 7, there are a first internal voltage VARY (1.0 V), a second internal voltage VPP (2.6 V), a third internal voltage VEQ (1.3V), and a fourth internal voltage VDLP (1.3V), for example. Among these voltages, the second internal voltage VPP is a stepped-up voltage obtained by stepping up the voltage VDD1, and the other internal voltages VEQ, VDLP, and VARY are stepped-down voltages obtained by stepping down the voltages VDD1 and VDD2. As a basic operation, a constant voltage is output as each internal voltage, based on a reference voltage which becomes a reference for a voltage value.

The internal voltage VDLP is mainly supplied to peripheral circuits other than the memory cell array region 33, such as the row address buffer 4 and the column address buffer 5, and each of the internal voltages (VEQ, VARY, VPP) other than the voltage VDLP is supplied to the memory cell array region 33.

In addition to the internal voltages (VEQ, VDLP, VARY, VPP) generated by the internal voltage generation circuit 7, a voltage which has been received through the power supply terminal VDD2 is output without alteration via a transistor without being stabilized, as a voltage VPERI. The voltage VPERI is supplied to the internal circuits of the semiconductor device 1 including the memory cell array region 33.

Further, the internal voltage generation circuit 7 includes an internal voltage control unit 37. The internal voltage control unit 37 performs control so that when the voltage at the power supply terminal VDD2 rises to exceed a predetermined value, an operation of stabilizing at least a portion of the internal voltages is stopped to cause at least the portion of the internal voltages to increase with the rise of the power supply voltage. A detailed description of the control will be described later.

(Configuration of Memory Cell Array Region)

Figure 2:
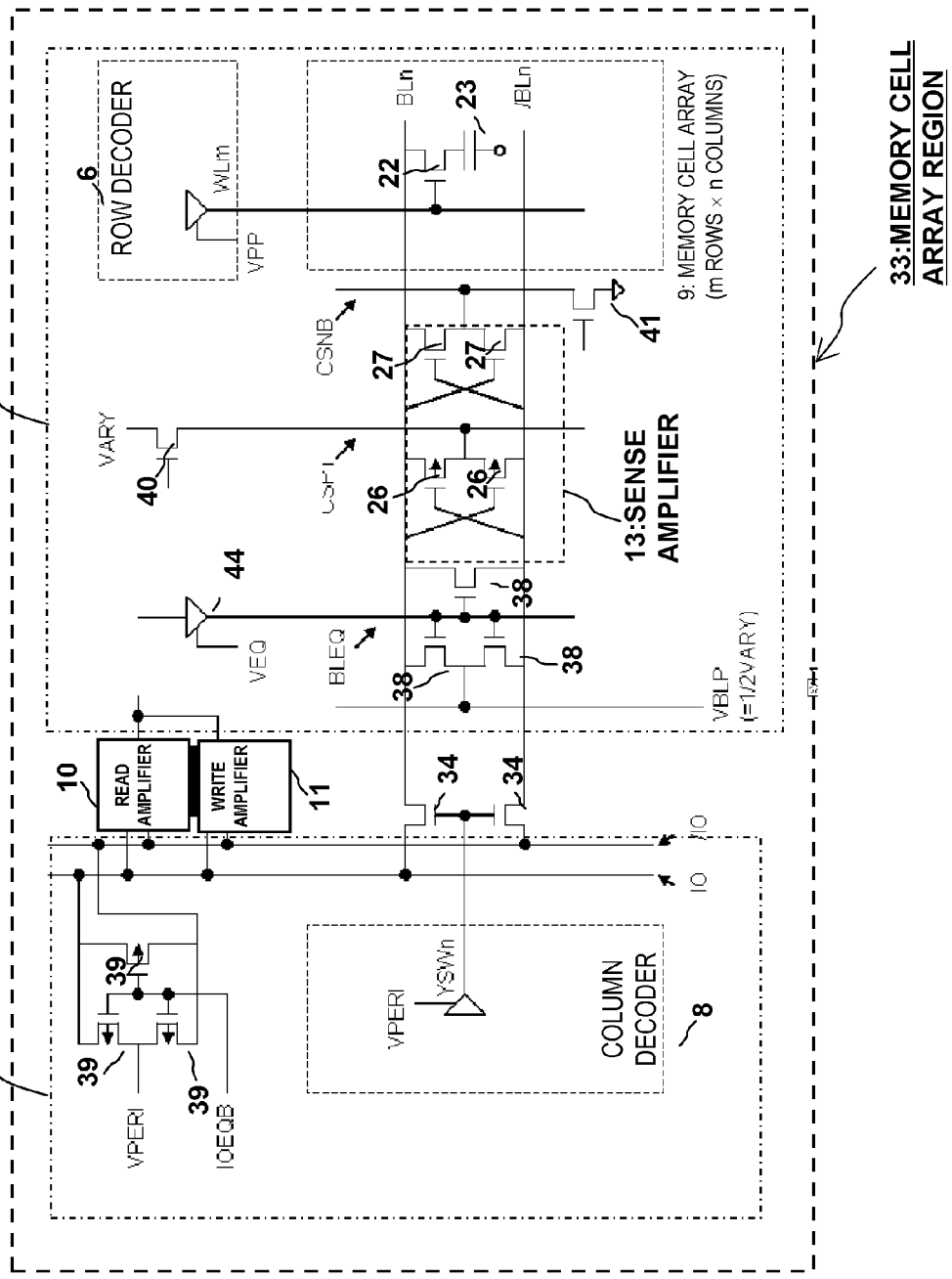
FIG. 2 is a circuit block diagram showing an inside of a memory cell array region in FIG. 1.

FIG. 2 is a circuit block diagram showing an inside of the memory cell array region 33 in FIG. 1. Basically, the memory cell array region includes an external voltage operation block which operates by supply of the power supply voltage supplied through the power supply terminal VDD2 almost without alteration, as the voltage VPER1, and an internal voltage operation block which operates by supply of the internal voltages (VEQ, VARY, VPP) generated by the internal voltage generation circuit 7.

The internal voltage operation block 36 includes the memory cell array 9. In the memory cell array 9, m word lines WLm and n pairs of bit lines (BLn, /BLn) are disposed in an intersecting directions, and memory cells each comprising a memory cell transistor 22 and a capacitor 23 are connected to intersections between the word lines WLm and the bit line pairs (BLn, /BLn). Specifically, one of a source and a drain of the memory cell transistor 22 is connected to the capacitor 23, the other of the source and the drain of the memory cell transistor 22 is connected to the bit line BLn, and a gate of the memory cell transistor 22 is connected to the word line WLm. FIG. 2 illustrates only one word line, only one bit line pair, and only one memory cell as representatives of the word lines, the bit line pairs, and the memory cells. Actually, m rows of word lines and n columns of bit line pairs are wired, and m rows×n columns of the memory cells are arranged in the form of the matrix, corresponding to the intersections between the respective word lines and the respective bit line pairs.

Each word line WLm is connected to the row decoder 6. The second internal voltage VPP is supplied to the row decoder 6, and a selected one of the word lines is driven by the second internal voltage VPP.

A sense amplifier 13 is connected to each pair of the bit lines (BLn, /BLn). The sense amplifier 13 includes a set of (two) pMOS transistors 26 with gates and drains thereof connected to one of the pair of the bit lines (BLn /BLn) and the other of the pair of the bit lines (BLn /BLn), and a set of (two) nMOS transistors 27. A source of each pMOS transistor 26 is connected to a sense amplifier power supply line CSPT, and a source of each nMOS transistor 27 is connected to a sense amplifier ground line CSNB.

That is, the sense amplifier 13 is formed of a first inverter and a second inverter. Power supplies of the first inverter are respectively connected to the sense amplifier line CSPT and the sense amplifier ground line CSNB. An input terminal of the first inverter is connected to the bit line BLn, and an output terminal of the first inverter is connected to the bit line /BLn for reference. An input terminal of the second inverter is connected to the bit line /BLn for reference, and an output terminal of the second inverter is connected to the bit line BLn. The sense amplifier 13 may also be considered as a data holding circuit which temporarily holds data read from the memory cell array when a data read is executed.

The first internal voltage VARY is supplied to the sense amplifier power supply line CSPT through a transistor 40 when the sense amplifier 13 is activated. The voltage VSS (0V) is supplied to the sense amplifier ground line CSNB through an nMOS transistor 41 when the sense amplifier 13 is activated.

Referring to FIG. 2, the bit lines are arranged according to a folded bit line method. In the folded bit line method, the bit lines (BLn in the example of FIG. 2) connected to the memory cells and the bit lines for reference (/BLn in the example of FIG. 2) are wired to the memory cell array 9 in parallel. When the bit lines are arranged according to an open bit line method in which the bit lines for reference are connected to a different memory cell array via the sense amplifiers 13, the bit lines for reference (/BLn in the example of FIG. 2) do not need to be wired to the memory cell array 9.

The pair of the bit lines (BLn, /BLn) is connected to a bit line precharge circuit formed of three precharge transistors 38. The three precharge transistors 38 are all nMOS transistors, and all gates of the three precharge transistors 38 are connected to a bit line precharge signal BLEQ. A source and a drain of one of the three precharge transistors 38 are connected to one and the other of the pair of the bit lines. Sources of the two precharge transistors are connected in common to a precharge voltage line VBLP, and drains of the two precharge transistors are respectively connected to the one and the other of the pair of the bit lines.

A voltage that is half of the first internal voltage VARY is supplied to the precharge voltage line VBLP. A bit line precahrge signal driving circuit 44 for driving the bit line precharge signal BLEQ is provided, and the third internal voltage VEQ is supplied to the bit line precharge signal driving circuit 44. Accordingly, when the bit line precharge signal BLEQ is activated to precharge the bit lines, the bit line precharge signal BLEQ is driven to the voltage of the third internal voltage VEQ.

Ends of the pair of the bit lines (BLn, /BLn) are respectively connected to the external voltage operation block 35 through nMOS transistors 34 which serve as a column selection switch. As seen from the memory cell array 9, circuits of the external operation block 35 are circuits which are located more outer side of circuits within the internal voltage operation block 36. Basically, the external voltage operation block 35 is a circuit which operates on a voltage VPERI that is the same as the voltage supplied through the power supply terminal VDD2.

A column selection signal YSWn output from the column decoder 8, which is a circuit in the external voltage operation block 35, is connected to gates of the nMOS transistors 34 which serve as the column selection switch. Since the voltage VPERI is supplied to the row decoder 8 as a power supply, the row selection signal YSWn is a signal based on the voltage VPERI, and is a signal having a voltage level that depends on the voltage of the power supply voltage VDD2.

The pair of the bit lines (BLn, /BLn) are connected to a pair of IO lines (IO, /IO) of the external voltage operation block 35 through the nMOS transistors 34 which serve as the column selection switch. The pair of IO lines (IO, /IO) is further connected to the read amplifier 10 and the write driver 11.

The pair of IO lines (IO, /IO) is connected to an IO line precharge circuit formed of three precharge transistors 39. The three precharge transistors 39 are all pMOS transistors, and gates of the three precharge transistors 39 are all connected to an IO line precharge signal IOEQB. A source and a drain of one of the three precharge transistors 39 are connected to one and the other of the pair of IO lines, and sources of remaining two of the three precharge transistors 39 are connected in common to the voltage VPERI, and drains of the remaining two of the three precharge transistors 39 are respectively connected to one and the other of the pair of IO lines.

(Configurations of Power Supply Circuits)

Figure 3:
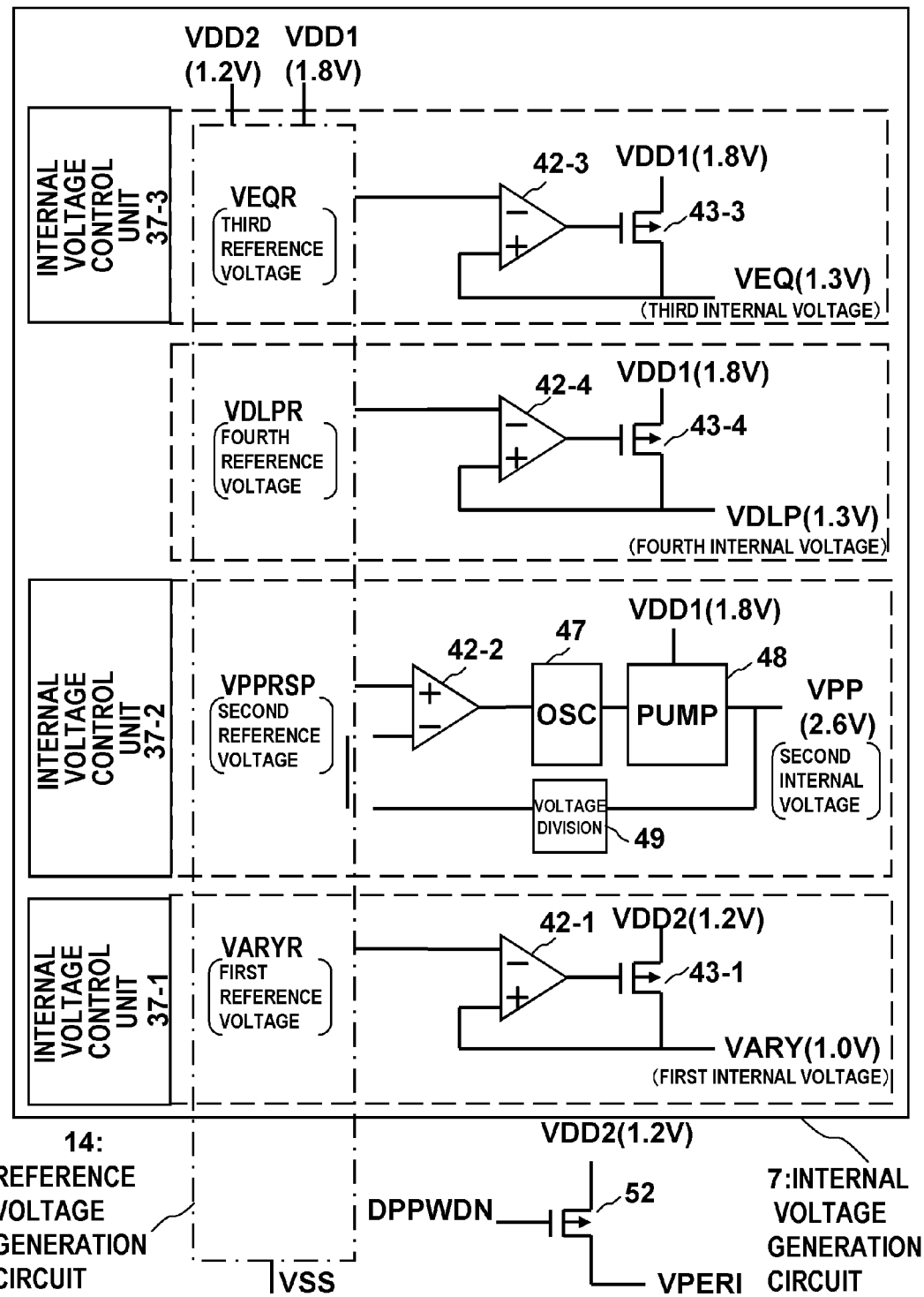
FIG. 3 is a diagram showing configurations of power supply circuits inside the semiconductor device in FIG. 1.

Next, configurations of power supply circuits inside the semiconductor device in FIG. 1 will be described. FIG. 3 is a diagram showing the configurations of the internal voltage generation circuit 7 and the power supply circuit of the voltage VPERI. As already explained, the internal voltage generation circuit 7 is a power supply circuit which generates the first internal voltage VARY (1.0 V), the second internal voltage VPP (2.6 V), the third internal voltage VEQ (1.3 V), the fourth internal voltage VDLP (1.3 V) based on the voltages supplied from the power supply terminal VDD1 (of 1.8 V), the power supply terminal VDD2 (of 1.2 V), and the power supply terminal VSS (of 0V).

The internal voltage generation circuit 7 includes a reference voltage generation circuit 14 which outputs stable reference voltages which are affected as little as possible by the power supply voltages supplied from the outside. The reference voltage generation circuit 14 outputs a first reference voltage VARYR, a second reference voltage VPPRSP, a third reference voltage VEQR, and a fourth reference voltage VDLPR which become references of the internal voltages VARY, VPP, VEQ, and VDLP, respectively.

Basically, each of the reference voltages VARYR, VPPRSP, VDLPR, and VEQR is a signal indicating a stable voltage which does not depend on the power supply voltages supplied from the power supply terminals VDD1 and VDD2.

The internal voltage generation circuit 7 outputs the internal voltages VARY, VPP, VEQ, and VDLP based on the reference voltages VARYR, VPPRSP, VEQR, and VDLPR, respectively. To take an example, the first reference voltage VARYR is connected to one of differential inputs of a differential circuit 42-1, the first internal voltage VARY is output by a power supply transistor 43-1 which is controlled to turn on by an output signal of the differential circuit 42-1, and the first internal voltage VARY is connected to the other of the differential inputs of the differential circuit 42-1. With this configuration, the differential circuit 42-1 and the power supply transistor 43-1 function as a voltage follower circuit, so that a voltage which is substantially the same as the first reference voltage VARYR is output as the first internal voltage VARY. Accordingly, the value of the voltage output as the internal voltage VARY depends on the value of the voltage of the reference voltage VARYR. To which one of inverting and non-inverting input terminals of the differential circuit 42-1 the reference voltage is connected as an input signal and to which one of the inverting and non-inverting input terminals of the differential circuit 42-1 the internal voltage is connected as a feedback signal differ, depending on whether an output impedance of the power supply transistor 43-1 increases or decreases when a high voltage is supplied to a gate of the power supply transistor 43-1. Referring to FIG. 3, a pMOS transistor is used of which the output impedance of the power supply transistor increases when the high voltage is supplied to the power supply transistor. Thus, the first reference voltage VARYR is connected to the inverting input terminal as the input signal, and the first internal voltage VARY is connected to the non-inverting input terminal as the feedback signal.

In sofaras explained, each of circuits which generate the internal voltages VDLP and VEQ has a same basic circuit configuration as that of the internal voltage generation circuit which outputs the first internal voltage VARY, only excepting that the names and the voltage values of signals of the circuit differ. Accordingly, detailed descriptions of these circuits will be omitted.

The second reference voltage VPPRSP is connected to one of differential input terminals of a differential circuit 42-2, and a voltage signal obtained by voltage-dividing the second internal voltage VPP by a voltage division circuit 49 is connected to the other of the differential input terminals. An output terminal of the differential circuit 42-2 is connected to an oscillation circuit 47, and controls an oscillating operation of the oscillation circuit 47. Herein, when the output terminal of the differential circuit 42-2 outputs a high level, the oscillation circuit 47 oscillates. When the output terminal of the differential circuit 42-2 outputs a low level, the oscillation circuit 47 stops oscillation. An oscillation signal of the oscillation circuit 47 is connected to a charge pump circuit 48 to control a step-up operation of the charge pump circuit 48. A voltage output by the charge pump circuit 48 becomes the internal voltage VPP. That is, the second internal voltage VPP outputs the voltage determined by a voltage division ratio of the voltage division circuit 49, in response to the second reference voltage VPPRSP.

The voltage VPERI, which is used by the internal circuits and is not stabilized, is fed as a voltage supplied from the power supply terminal VDD2 through a power supply transistor 52 that is a pMOS transistor. When the semiconductor device 1 enters into a deep power down mode, the power supply transistor 52 turns off. Power supply to the voltage VPERI is thereby stopped. When the semiconductor device 1 operates, the power supply transistor is always on. Accordingly, when the semiconductor device 1 operates, the voltage value of the voltage VPERI is substantially equal to the value of the power supply voltage supplied from the power supply terminal VDD2.

As described above, by using the internal voltages VARY, VPP, and VEQ which depend on the power supply voltages supplied to the power supply terminals VDD1 and VDD2 from the outside as little as possible for the memory cell array and the peripheral circuits of the memory cell array, operation which is stable as much as possible for a variation of one of the power supply voltages supplied from the power supply terminals can be performed. Further, by using the fourth internal voltage VDLP to the internal circuits other than the memory cell array region, a delay circuit or the like, of which a delay amount is constant even if one of the power supply voltages varies, can be used.

By using the power supply voltages directly supplied from the power supply terminals for a circuit which directly performs input from and output to the outside of the semiconductor device 1, a circuit related to the input/output, and further a circuit which operates at high speed for data transfer or the like and therefore consumes large power, the need for requiring an excessive power supply capability to the internal voltage generation circuit is eliminated.

(Operations in Memory Cell Array Region)

Among the internal voltages VARY, VPP, VDLP, and VEQ generated by the internal voltage generation circuit in this exemplary embodiment, for circuits of generation of the internal voltages VARY, VPP, and VEQ which are supplied to the memory cell array region 3 except the fourth internal voltage VDLP, internal voltage control units 37-1, 37-2, and 37-3 are respectively provided. The fourth internal voltage VDLP is supplied to the regions other than the memory cell array region 33. Provision of the internal voltage control units 37-1, 37-2, and 37-3 makes it possible for the internal voltage generation circuit 7 to stop the operation of stabilizing the internal voltages VARY, VPP, VEQ when one of the voltages supplied from the power supply terminals VDD1 and VDD2 has risen beyond a certain limit. The internal voltages VARY, VPP, and VEQ can therefore vary, following the voltage supplied from the power supply terminals. A description will be directed to the reason why the internal voltage control units 37-1, 37-2, and 37-3 are provided in this exemplary embodiment and in a specific case control is performed so that the operation of stabilizing the voltages VARY, VPP, and VEQ is stopped to cause the voltages VARY, VPP, and VEQ to follow the external voltage.

Figure 4:
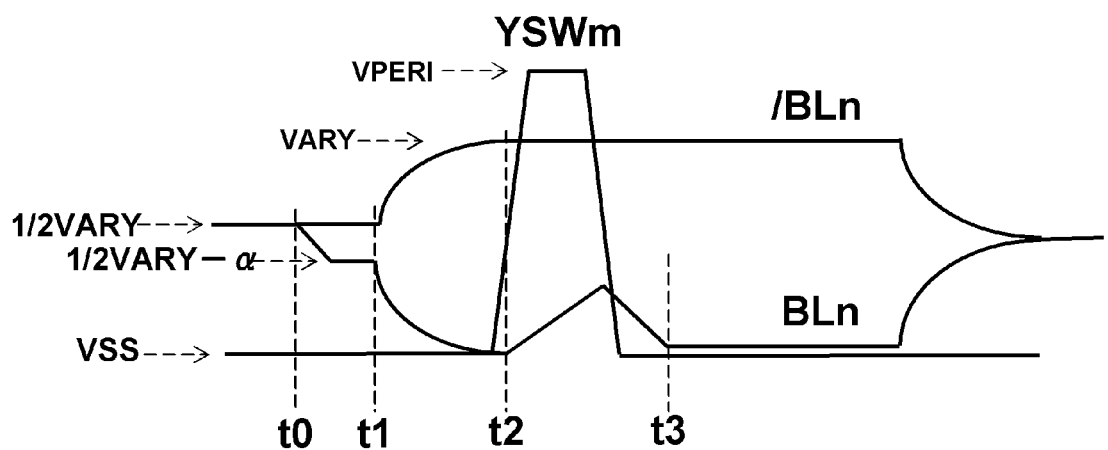
FIG. 4 is a waveform diagram explaining variations of potentials of bit lines when a column selection switch is selected in a related art semiconductor device.

A read/write operation for the memory cell array 9 will be described, using a circuit block diagram of the memory cell array region 33 in FIG. 2 and a waveform diagram in FIG. 4 explaining variations of potentials of bit lines when a column selection switch is selected. Referring to FIG. 4, before a timing t0 at which a word line is selected, the precharge signal BLEQ is active, and both of the pair of bit lines (BLn, /BLn) are precharged to ½ VARY. The third internal voltage VEQ corresponds to a voltage for activating the precharge signal BLEQ.

Then, when the word line is selected at the timing t0, the internal voltage VPP is supplied to the word line. The memory cell transistor 22 thereby turns on, and data (voltage) held by the capacitor 23 is moved to the bit line (BLn) (½ VARY−α). At this point, the other of the pair of bit lines, which is /BLn, is held at the precharge voltage of ½ VARY.

Next, at a timing t1, the first internal voltage VARY is supplied to the sense amplifier power supply line CSPT to drive the sense amplifier 13. Then, the difference potential α of the pair of the bit lines is amplified by the sense amplifier 13. Thus, the voltage at the bit line /BLn is amplified to a voltage which is the same as the first internal voltage VARY, and the bit line BLn is amplified to a voltage that is the same as the voltage of the power source VSS. A potential difference between the bit lines is thus amplified.

Since the pair of the bit lines is connected to the pair of the IO lines through the transistors 34, the transistors 34 turn on at a timing t2 when the read/write operation is performed. Then, the bit line pair is connected to the IO line pair. When the read operation is performed, for example, the data amplified by the sense amplifier is connected to the read amplifier 10 through the IO line pair. The amplitude reduced by load capacitances of the IO lines or the like is amplified by the read amplifier 10 and is further output to the outside. Before these transistors 34 turn on, the IO line pair is precharged to a VPERI level in advance by the precharge transistors 39 for the IO line pair. The voltage VPERI (which is substantially the same voltage as the voltage VDD2) is higher than the voltage VARY which is the power supply for the sense amplifier. When the voltage VDD2 is within a specified range, no problem arises. Due to the low level (VSS level) of one of the pair of the bit lines output from the sense amplifier 13, electric charges on one of the pair of the IO lines precharged to the voltage VPERI are discharged through the nMOS transistor 34. With this arrangement, one of the pair of the IO lines is driven to the low level (VSS level). Thus, the read amplifier 10 can read and amplify the data read onto the pair of the IO lines.

When the transistors 34 that serve as the column selection switch turn on at the timing t2 as shown in FIG. 4, the potential of the low level of the bit line rises from the voltage VSS due to precharged electric charges held by the IO lines. However, the data held in the sense amplifier 13 is not inverted. When the transistors 34 turn off, the potentials of the bit lines return to the potentials with the amplified potential difference before the transistors 34 turn on.

Figure 5:
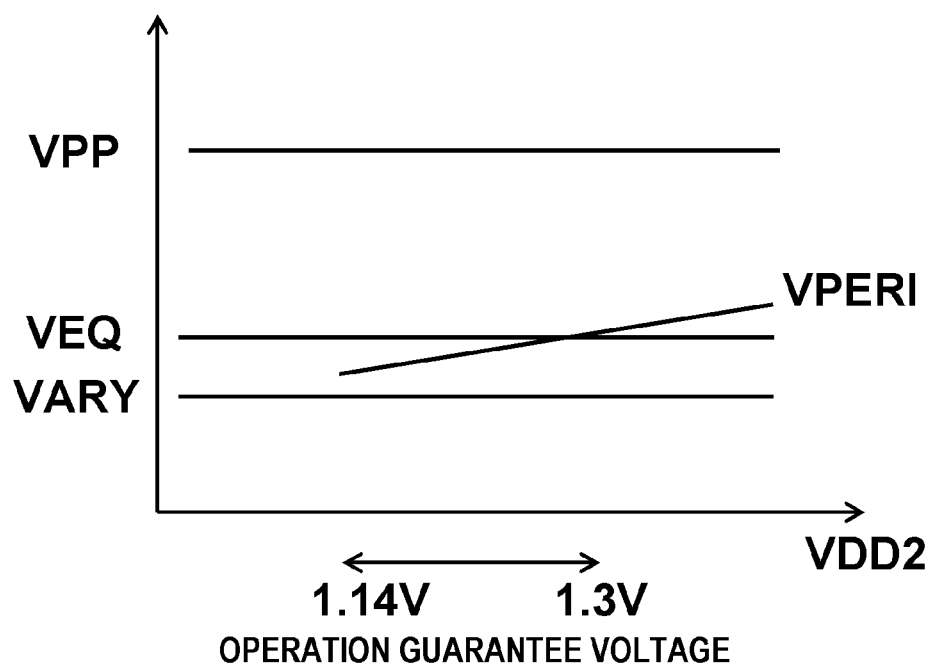
FIG. 5 is a graph showing variations of internal voltages when an external power supply voltage VDD2 varies in the related art semiconductor device.

FIG. 5 shows respective relationships between the voltage supplied from the power supply terminal VDD2 and the voltages VARY, VPP, VEQ, VPERI used for the internal circuits when the internal voltage control units 37-1 to 37-3 are not provided at the internal voltage generation circuit 7. When the internal voltage control units 37-1 to 37-3 are not provided, the internal voltages VARY, VPP, and VEQ output by the internal voltage generation circuit 7 are scarcely affected by a voltage supplied from the power supply terminal VDD2, and have flat voltage characteristics. On the other hand, the voltage VPERI varies, depending on the voltage supplied from the power supply terminal VDD2. When the voltage supplied from the power supply terminal VDD2 is within an operation guarantee voltage range (from 1.14 V to 1.3V, for example), no particular problem arises.

When a high voltage exceeding the operation guarantee voltage range is supplied to the power supply terminal VDD2, the voltage VPERI may be too high for the internal voltage VARY which is the power supply voltage of the sense amplifier 13. When the voltage VPERI is too high for the first internal voltage VARY which is the power supply voltage of the sense amplifier 13, the IO lines are precharged to a voltage level of the voltage VPERI. Thus, when the transistors 34 turn on at a time of a read operation, data held in the sense amplifier 13 may be inverted by precharged electric charges on the IO lines.

A mask operation may be performed for each bit at a time of a write operation as well as a read operation. In such a case, for the bit for masking at the time of the write operation, it is necessary that the write driver should become a high impedance state and the sense amplifier should hold data read from the memory cell array and write back the held data to the memory cell. However, the IO lines hold electric charges precharged to the VPERI level at the time of the write operation. Thus, the data held in the sense amplifier may be inverted by the electric charges held by the IO lines, as in the read operation.

To cope with this problem, the internal voltage control unit 37-1 is provided for the internal voltage generation circuit 7 in the semiconductor device 1 in the first exemplary embodiment. With this arrangement, when the power supply voltage VDD2 supplied from the outside rises to exceed the predetermined value, control is performed so that the operation of stabilizing the first internal voltage VARY is stopped to cause the first internal voltage VARY to increase with the rise of the power supply voltage VDD2. Accordingly, inversion of the data held in the sense amplifier by the precharge electric charges on the IO lines can be avoided.

When the voltage value of the first internal voltage VARY is risen, the power supply voltage of the sense amplifier 13 rises, and the precharged voltage ½ VARY of the bit lines also rises. On the other hand, when the second internal voltage VPP remains fixed and a word line is selected, a potential difference between the voltage VPP of the word line and the precharged voltage ½ VARY of the bit line is reduced. Reading of cell data at a time of turning on of the memory cell transistor 22 is delayed. Accordingly, when the voltage of the first internal voltage VARY is risen, it is preferable that the voltage of the second internal voltage VPP be also risen. For that reason, the internal voltage control unit 37-2 is provided for the internal voltage generation circuit 7 shown in FIG. 3. The internal voltage control unit 37-2 is provided for varying the second internal voltage VPP with a voltage variation of the power supply voltage VDD2 when the first internal voltage VARY is varied with the voltage variation of the power supply voltage VDD2.

It is also preferable that a voltage level of a third control signal VEQ which is the power supply of the bit line precharge signal driving circuit 44 be also risen with the rise of the bit line precharged voltage ½ VARY. For that reason, the internal voltage control unit 37-3 is provided for the internal voltage generation circuit 7 shown in FIG. 3. The internal voltage control unit 37-3 is provided for varying the third internal voltage VEQ with the variation of the power supply voltage VDD2 when the first internal voltage VARY is varied with the voltage variation of the power supply voltage VDD2.

As described above, the internal voltage control units 37-2 and 37-3 are provided for varying the second internal voltage VPP and the third internal voltage VEQ following a variation of the power supply voltage VDD2 supplied from the outside when the first internal voltage VARY is varied following the variation of the power supply voltage VDD2. On the other hand, the fourth internal voltage VDLP is not the internal voltage used for the memory cell array region 33. Thus, even when the first internal voltage VARY is varied following a voltage variation of the power supply voltage VDD2 supplied from the outside, the fourth internal voltage VDLP is controlled to maintain a constant voltage. Accordingly, an internal voltage control unit is not provided for the internal voltage generation circuit which generates the fourth internal voltage VDLP.

When the internal voltage control unit 37-3 is not operated, an output voltage value of the fourth internal voltage VDLP is almost the same as an output voltage value of the third internal voltage VEQ. However, when the power supply voltage VDD2 supplied from the outside rises to exceed the predetermined value, the third internal voltage VEQ needs to vary following the voltage value of the power supply voltage VDD2 supplied from the outside. On contrast therewith, the fourth internal voltage needs to maintain the constant voltage. Accordingly, the internal voltage generation circuit for generating the third internal voltage VEQ and the internal voltage generation circuit for generating the fourth internal voltage VDLP are provided as separate circuits.

First Example

Figure 6:
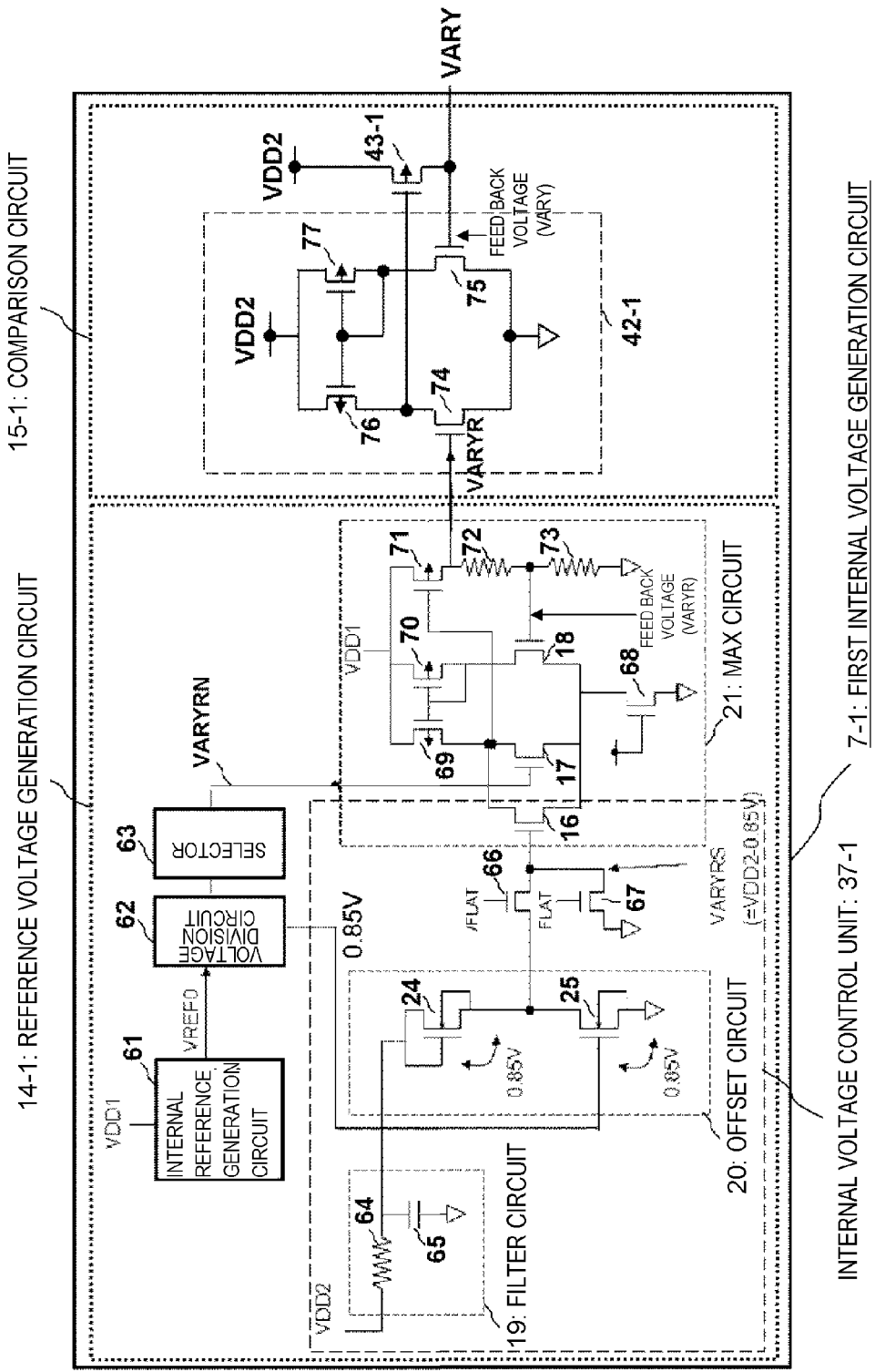
FIG. 6 is a circuit block diagram of a first internal voltage (sense amplifier power supply voltage) generation circuit in an example.

A specific circuit example of an internal voltage generation circuit 7 will be described. A specific circuit of a reference voltage generation circuit 14 in particular will be described in detail. FIG. 6 is a circuit block diagram of a first internal voltage generation circuit which outputs a first internal voltage VARY. A configuration of the first internal voltage generation circuit will be described. The first internal voltage generation circuit 7-1 includes a reference voltage generation circuit 14-1 which outputs a first reference voltage VARYR and a comparison circuit 15-1 which outputs the first internal voltage VARY of a voltage that is the same as that of the first reference voltage VARYR.

The reference voltage generation circuit 14-1 includes an internal voltage control unit 37-1. When this internal voltage control unit 37-1 does not operate, the reference voltage generation circuit 14-1 outputs the first reference voltage VARYR which is always stabilized with respect to a variation of a power supply voltage VDD2 or a power supply voltage VDD1 provided from an outside. When the internal voltage control unit 37-1 operates, and when a voltage value of the reference voltage VDD2 exceeds a predeterminate voltage value, the operation for stabilization is stopped. A voltage that depends on the voltage value of the power supply voltage VDD2 is output as the first reference voltage VARYR.

The reference voltage generation circuit 14-1 includes an internal reference generation circuit 61 to which a power supply is provided from a power source VDD1 and which outputs a stable reference voltage VREF0 that scarcely depends on a voltage value of the power source VDD. The reference voltage VREF0 output by the reference voltage generation circuit 6 is voltage-divided by a voltage division circuit 62 to be output as a first control voltage VARYRN through a selector 63. The first control voltage VARYRN is a control signal which outputs an almost constant voltage that scarcely depends on voltage values of the power supply voltages VDD1 and VDD2 provided from the outside.

The internal voltage control unit 37-1 includes a filter circuit 19 which receives a power supply VDD2 provided from the outside, and removes a high-frequency component from the voltage value of the power supply VDD2. The filter circuit 19 may be a filter circuit using a resistance 64 and a capacitor 65, as shown in FIG. 6.

The power supply VDD2 from which the high-frequency component has been removed by the filter circuit 19 is connected to an offset circuit 20. The offset circuit 20 includes an nMOS transistor 24 with a drain and a gate thereof connected in common to an output voltage of the filter circuit 19 and an nMOS transistor 25 with a source thereof connected to a power source VSS (0V) and a drain thereof connected to a source of the nMOS transistor 24.

A gate of the nMOS transistor 25 is connected to a voltage signal output by the voltage division circuit 62. The voltage division circuit 62 voltage-divides the reference voltage VREF0 output by the internal reference generation circuit 61. Thus, the voltage output by the voltage division circuit 62 becomes the voltage signal of a certain fixed level.

The nMOS transistor 25 and the nMOS transistor 24 are transistors of a same conductivity type having same characteristics. Current which flows through the drain and the source of the nMOS transistor 25 is equal to current which flows through the drain and the source of the nMOS transistor 24. Accordingly, a drain-source voltage (or a gate-source voltage) of the nMOS transistor 24 is also controlled to be almost the same as a gate-source voltage of the nMOS transistor 25. When the voltage output by the voltage division circuit 62 is 0.85V as written down in FIG. 6 as an example, the drain-source voltage of the nMOS transistor 24 is also controlled to be 0.85V. Accordingly, VDD2–0.85V is obtained from an output node of the offset circuit 20.

A second control voltage VARYRS is output from the output node of the offset circuit 20 through a selector circuit formed of an nMOS transistor 66 and nMOS transistor 67. One of a source and a drain of the nMOS transistor 66 is connected to the output node of the offset circuit 20, and the other of the source and the drain of the nMOS transistor 66 is connected to a drain of the nMOS transistor 67, and the the second control voltage VARYRS is output. A source of the nMOS transistor 67 is connected to the power source VSS (0V).

To a gate of the nMOS transistor 67, a FLAT signal is connected, and a /FLAT signal, which is an inverted signal of the FLAT signal, is connected to a gate of the nMOS transistor 67. The FLAT signal is a signal which switches whether or not to vary the first reference voltage VARYR following the voltage of the power supply VDD2 when the power supply VDD2 has risen to exceed the predetermined value or to maintain a flat voltage characteristic of the first reference voltage VARYR even when the power supply VDD2 has risen to exceed the predetermined value. When the FLAT signal is activated high, the second control voltage VARYRS is fixed at 0V. On the other hand, when the /FLAT signal goes high, the second control voltage VARYRS of VDD2−0.85V which is output from the offset circuit 20 is output. That is, the second control voltage VARYRS depends on the voltage value of the power supply VDD2 which indicates the power supply voltage provided from the outside, and is a voltage that is shifted from the voltage value of the power supply VDD2 by a given voltage by the offset circuit 20.

The following description will be given, on the assumption that the /FLAT signal is high and VDD2−0.85V is output as the second control voltage VARYRS.

A MAX circuit 21 receives the first control voltage VARYRN and the second control voltage VARYRS, and outputs the first reference voltage VARYR. The MAX circuit 21 includes an nMOS transistor 68 which becomes a current source, and a differential pair comprising nMOS transistors 17 and 16 with sources thereof connected in common to a drain of the nMOS transistor 68, and an nMOS transistor 18. One of the differential pair is formed of the nMOS transistor 18 alone, and the other of the differential pair is formed of the two nMOS transistors 17 and 16 with the sources and drains thereof connected in common and gates thereof connected to different signals. A gate of the nMOS transistor 17 is connected to the first control signal VARYRN, and a gate of the nMOS transistor 16 is connected to the second control signal VARYRS.

A load circuit formed of pMOS transistors 69 and 70 with sources thereof connected in common to an external power source VDD1 is connected to the drains of the nMOS transistors 17 and 16 and a drain of the nMOS transistor 18 forming the differential pair. Gates of the pMOS transistors 69 and 70 are connected to each other to a drain of the pMOS transistor 70 and the dain of the nMOS transistor 18. A drain of the PMOS transistor 69 is connected to the drains of the nMOS transistor 16 and 17 and a gate of an nMOS transistor 71 which serves as an output transistor of the MAX circuit.

A source of the nMOS transistor 71 is connected to the power source VDD1, and a drain of the nMOS transistor 71 becomes an output node of the MAX circuit 21 to output the reference voltage VARYR. A drain of the nMOS transistor 71 is connected to the power source VSS (0V) through resistances 72 and 73 connected in series. The resistances 72 and 73 connected in series between the drain of this nMOS transistor 71 and the power source VSS (0V) form a voltage division circuit, wherein a connecting point between the resistances 72 and 73 is connected to a gate of the nMOS transistor 18 which forms the differential pair, as an output voltage of the voltage division circuit.

This MAX circuit 21 controls a voltage of the first reference voltage VARYR so that a higher one of the first control voltage VARYRN and the second control voltage VARYRS connected to the gates of the nMOS transistors 16 and 17 of one of the differential pair is equal to the output voltage of the voltage division circuit formed of the resistances 72 and 73 connected to the gate of the nMOS transistor 18 which is the other of the differential pair.

The output voltage of the voltage division circuit formed of the resistances 72 and 73 is a voltage obtained by voltage-dividing the first reference voltage VARYR by a resistance ratio of the voltage division circuit. Accordingly, a voltage which is proportional to the higher one of the first control voltage VARYRN and the second control voltage VARYRS by the reciprocal of the voltage division ratio between the resistances of the voltage division circuit can be obtained, as the first reference voltage VARYR. To take an example, when the voltage division ratio of the voltage division circuit formed of the resistances 72 and 73 is ½, twice the voltage of the higher one of the first control voltage VARYRN and the second control voltage VARYRS is obtained, as the first reference voltage VARYR.

According to the configuration of the MAX circuit 21, the voltage which is proportional to the higher one of the first control voltage VARYRN and the second control voltage VARYRS is always obtained as the first reference voltage VARYR. Thus, not only when the first control voltage VARYRN and the second control voltage VARYRS are almost the same, but when the first reference voltage VARYR transitions from a voltage being proportional to the first control voltage VARYRN to a voltage being proportional to the second control voltage VARYRS or transitions from the voltage being proportional to the second control voltage VARYRS to the voltage being proportional to the first control voltage VARYRN to the contrary, the first reference voltage VARYR can transition seamlessly, without changing in a stepwise manner.

As already explained, the first control voltage VARYRN is a constant voltage which does not depend on a voltage level of the power supply voltage VDD1 or VDD2. On the other hand, the second control voltage VARYRS is a voltage which depends on the power supply voltage VDD2. Accordingly, when the first control voltage VARYRN is equal to or larger than the second control voltage VARYRS, the first reference voltage VARYR becomes the voltage being proportional to the first control voltage VARYRN. That is, the first reference voltage VARYR outputs an internal voltage, based on the first control voltage VARYRN, which is stabilized with respect to a variation of the power supply voltage supplied from the outside.

On the other hand, when a voltage value of the power source VDD2 rises, and when the voltage value (VDD−0.85V) of the second control voltage VARYRS thereby exceeds the voltage value of the first control voltage VARYRN, the first control voltage VARYRN becomes a voltage less than the second control voltage VARYRS. Thus, the first reference voltage VARYR becomes a voltage which is proportional to the voltage of the second control voltage VARYRS and varies following a voltage variation of the power source VDD2.

As already explained using FIG. 3, the comparison circuit 15-1 includes a differential circuit 42-1 and a pMOS transistor 43-1 which becomes a power supply transistor. Further, the differential circuit 42-1 includes nMOS transistors 74 and 75 and pMOS transistors 76 and 77. In the first example shown in FIG. 6, a voltage which is substantially equal to the first reference voltage VARYR is output as the first internal voltage VARY.

Second Example

Figure 7:
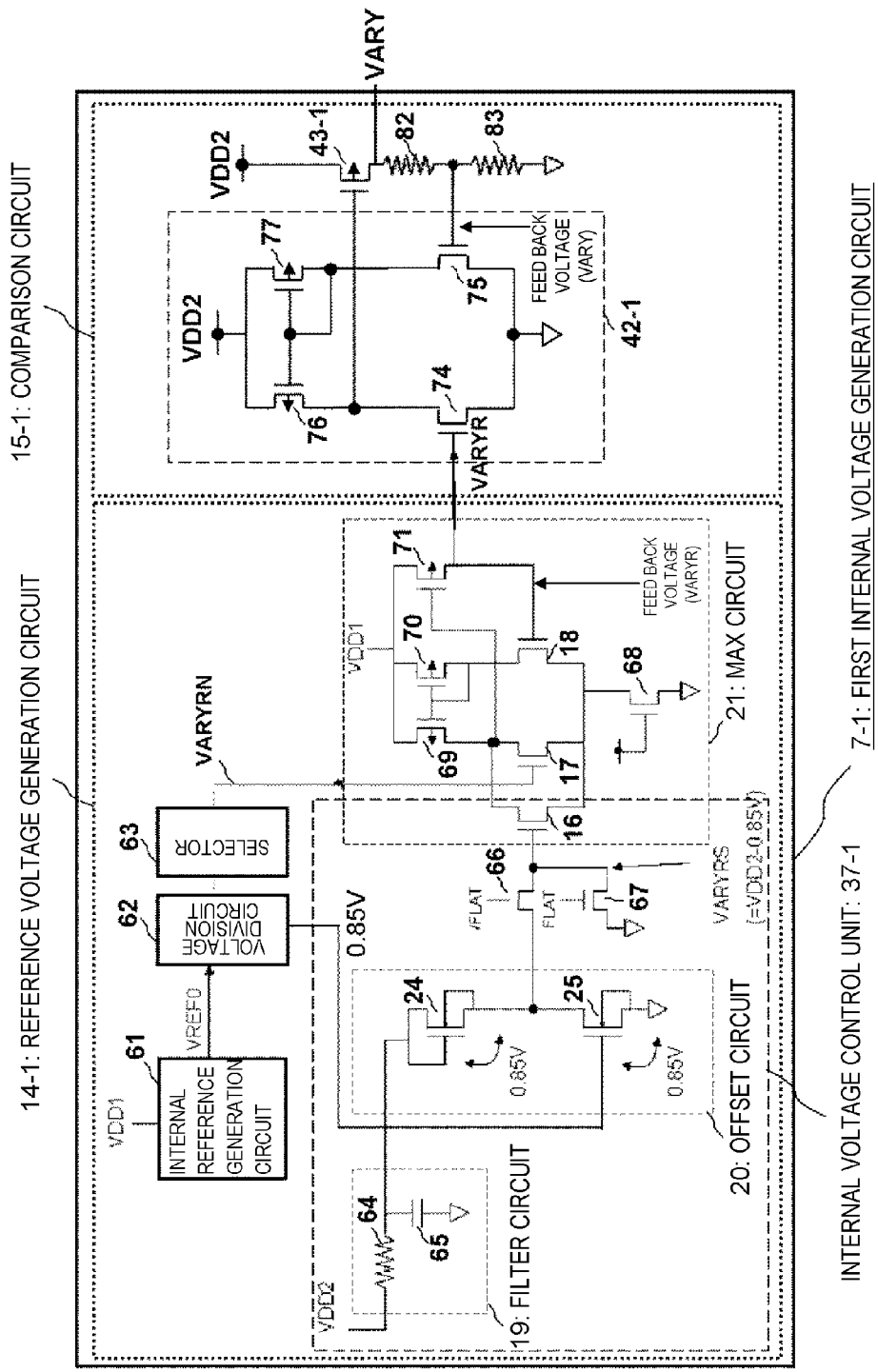
FIG. 7 is a circuit block diagram of a first internal voltage (sense amplifier power supply voltage) in another example.

FIG. 7 is a circuit block diagram of a first internal voltage generation circuit which outputs a first internal voltage VARY and has a configuration that is different from the configuration of the first example. The configuration of the first internal voltage generation circuit will be described. Same symbols are assigned to components which have same configurations as those in the first example shown in FIG. 6 and have already been described with reference to FIG. 6, repeated descriptions of the components will be thereby omitted. In the second example shown in FIG. 7, the voltage division circuit using the resistances 72 and 73 provided at the MAX circuit 21 in the first example is omitted. In place of the voltage division circuit in the first example, a voltage division circuit using resistances 82 and 83 is provided. The resistances 82 and 83 are connected in series between an output node (drain of a power supply transistor 43-1 whose source is supplied with VDD2) of the comparison circuit 15-1 and the power source VSS (0V) is provided, and a voltage voltage-divided by the voltage division circuit (82, 83) is connected to a gate of an nMOS transistor 75 which forms a differential pair (together with an nMOS transistor 74). The other configurations are the same as those of the first internal voltage generation circuit 7-1 in the first example shown in FIG. 6.

In the first internal voltage generation circuit 7-1 in the second example in FIG. 7, the reference voltage generation circuit 14-1 in a preceding stage outputs a voltage which is the same as a higher one of a first control voltage VARYRN and a second control voltage VARYRS, as a first reference voltage VARYR. In the comparison circuit 15-1, a voltage which is proportional to the reciprocal of the voltage division ratio of the voltage division circuit (82, 83) concerned and is higher than the first reference voltage VARYR is output as a first internal voltage VARY, based on the voltage division ratio of the voltage division circuit concerned.

Third Example

Figure 8:
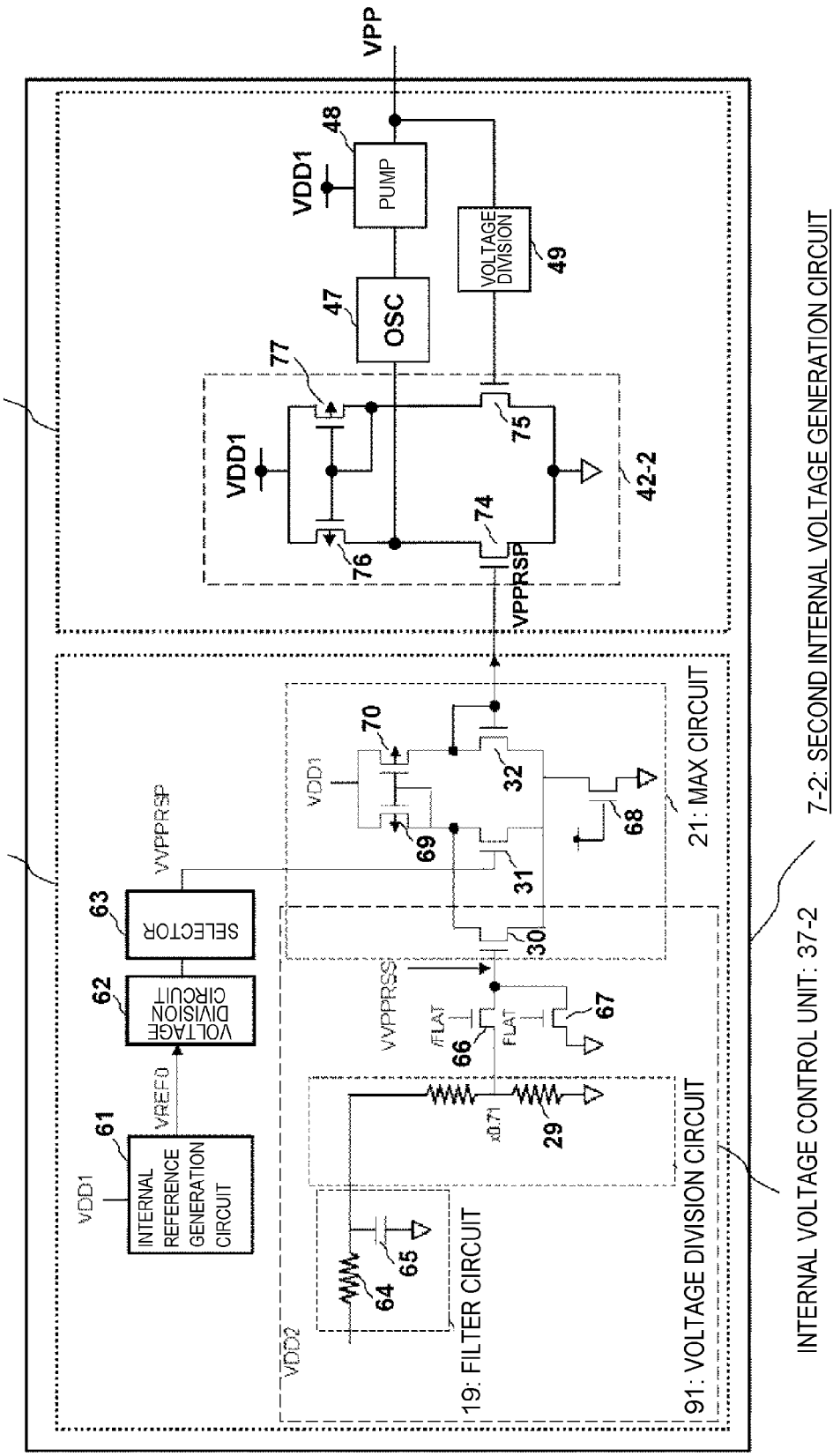
FIG. 8 is a circuit block diagram of a second internal voltage (row decoder power supply voltage) generation circuit in an example.

A third example is an example of a second internal voltage generation circuit 7-2 which outputs a second internal voltage VPP. FIG. 8 shows a circuit block diagram of the second internal voltage generation circuit in the third example. Same symbols are assigned to components which have same configurations as those in the first example shown in FIG. 6 and have already been described with reference to FIG. 6. Then, repeated descriptions of the components will be thereby omitted.

In the internal reference generation circuit 61 in a reference voltage generation circuit 14-2, a voltage value of a reference voltage VREF0 is the same as that of the internal reference generation circuit 61 in the first example, shown in FIG. 6. Accordingly, the internal reference generation circuit 61 which is common between the first internal voltage generation circuit 7-1 and the second internal voltage generation circuit 7-2 may be provided. The voltage division circuit 62 may also be made common between the first internal voltage generation circuit 7-1 in the first example and the second internal voltage generation circuit 7-2. However, output voltages of the first internal voltage generation circuit 7-1 and the second internal voltage generation circuit 7-2 are different. Thus, at least the selector 63 may be separately provided for each of the first example and the third example. In the third example, an output voltage VVPPRSP of the selector 63 in the third example is connected to the MAX circuit 21 as a third control voltage. The third control voltage VVPPRSP is an almost constant voltage which does not depend on a power supply voltage variation.

In the first example, the offset circuit 20 is employed to cause a voltage drop to a desired voltage in order to obtain a desired voltage value from the power supply voltage VDD2 at the internal voltage control unit 37-1. In the third example, a voltage division circuit 91 is provided in place of the offset circuit 20 to obtain the value of a desired voltage by resistance values of resistances 29 connected in series and provided for the voltage division circuit 91. The voltage obtained by voltage division by the voltage division circuit 91 is connected to the MAX circuit 21 through a selector circuit formed of nMOS transistors 66 and 67, as a fourth control voltage VVPPRSS. The fourth control voltage VVPPRSS becomes a voltage which depends on a voltage value of the power source VDD2.

The higher one of the third control voltage VVPPRSP and the fourth control voltage VVPPRSS connected to gates of nMOS transistors 30 and 31 forming a differential pair is output as a second reference voltage VPPRSP from the MAX circuit 21 as a whole.

The MAX circuit in the internal voltage generation circuit shown in the third example, for generating the second internal voltage VPP, has a configuration independent of the MAX circuit in the internal voltage generation circuit shown in each of the first and second examples for generating the first internal voltage VARY. Accordingly, the voltage value of the power supply voltage VDD2 when the internal voltage generation circuit for generating the first internal voltage VARY switches from a flat voltage output to a voltage output that depends on the power supply VDD2 does not always match the voltage value of the power supply voltage VDD2 when the internal voltage generation circuit for generating the second internal voltage VPP switches from a flat voltage output to a voltage output that depends on the power supply voltage VDD2.

However, as long as there is not a large deviation between a voltage value of the power supply voltage VDD2 at which the first internal voltage VARY switches from a flat voltage characteristic to a voltage characteristic that depends on the power supply voltage VDD2 and that of the power supply voltage VDD2 at which the second internal voltage VPP switches from a flat voltage characteristic to a voltage characteristic that depends on the power supply voltage VDD2, no practical problem occurs. By using the independent MAX circuit and by independently controlling the voltage value when the first internal voltage VARY switches from the flat voltage characteristic to the voltage characteristic that depends on the power supply voltage VDD2 and the voltage value when the second internal voltage VPP switches from the flat voltage characteristic to the voltage characteristic that depends on the power supply voltage VDD2, a voltage characteristic can be obtained of which each of the voltage values of the first internal voltage VARY and the second internal voltage VPP does not vary in a stepwise manner and switches seamlessly at a time of switching between the voltage characteristic that depends on the external power supply voltage and the voltage characteristic that does not depend on the external power supply voltage.

A comparison circuit 15-2 has a configuration as explained referring to FIG. 3. A differential circuit 42-2 includes nMOS transistors 74 and 75 and pMOS transistors 76 and 77 inside thereof, as shown in FIG. 8.

Figure 9:
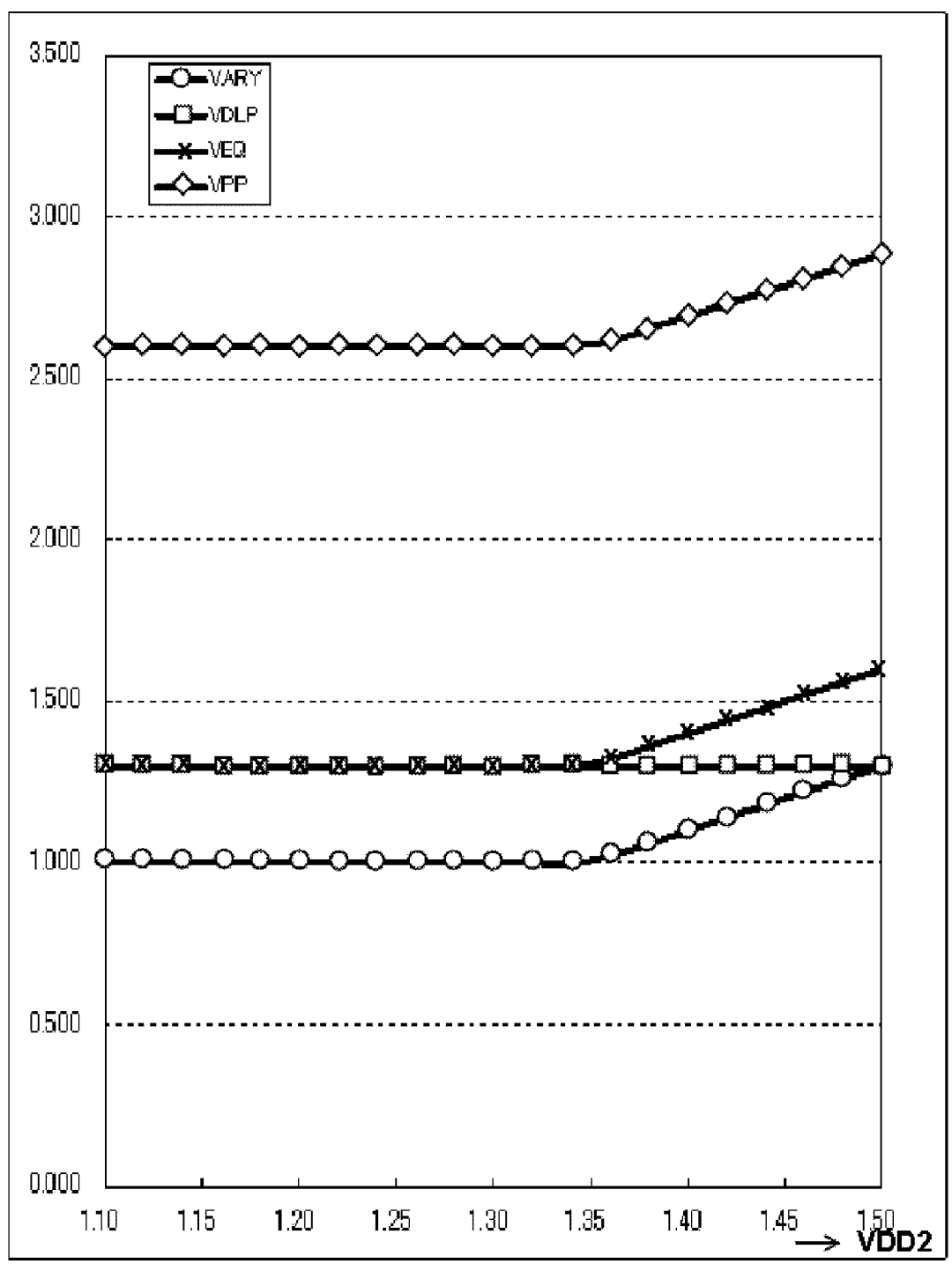
FIG. 9 is a graph showing an example of variations of internal voltages when an external power supply voltage VDD2 varies in the exemplary embodiment.

Finally, respective relationships between the power supply voltage VDD2 supplied from the outside of the semiconductor device in the exemplary embodiment of the present invention and each of the first internal voltage VARY, the fourth internal voltage VDLP, the third internal voltage VEQ, and the second internal voltage VPP are shown in FIG. 9. Referring to FIG. 9, a voltage value of power supply voltage VDD2 supplied from the outside is plotted on the abscissa, and voltage values of the first internal voltage VARY, the fourth internal voltage VDLP, the third internal voltage VEQ, and the second internal voltage VPP when the power supply voltage VDD2 is varied are plotted on the ordinate.

As shown in FIG. 9, when the power supply voltage VDD2 is equal to or less than 1.35V, each of the first to fourth internal voltages has a flat voltage characteristic that does not depend on the voltage value of the power supply voltage VDD2. Assume that the power supply voltage VDD2 is equal to or larger than 1.35 V. Then, all the voltage values of the first internal voltage VARY, the second internal voltage VPP, and the third internal voltage VEQ rise as the voltage of the power supply voltage VDD2 rises.

On the other hand, the fourth internal voltage VDLP has a flat voltage characteristic which does not depend on the power supply voltage in an entire region shown in FIG. 9.

Based on the fact that the internal voltages have the characteristics as shown in FIG. 9, the internal voltages VARY, VPP, and VEQ used for a memory access region vary, following the power supply voltage VDD2 when the power supply voltage VDD2 rises to exceed a specific voltage value. With this arrangement, when data is read from the internal voltage operation block to the external voltage operation block, a malfunction or the like can be avoided. On the other hand, the internal voltage VDLP used for a region other than the memory access region has the flat characteristic that does not depend on the power supply voltage the roughout in the entire range shown in FIG. 9. Thus, the internal voltage VDLP can be used for a circuit that does not depend on the power supply voltage provided from the outside.

Figure 10:
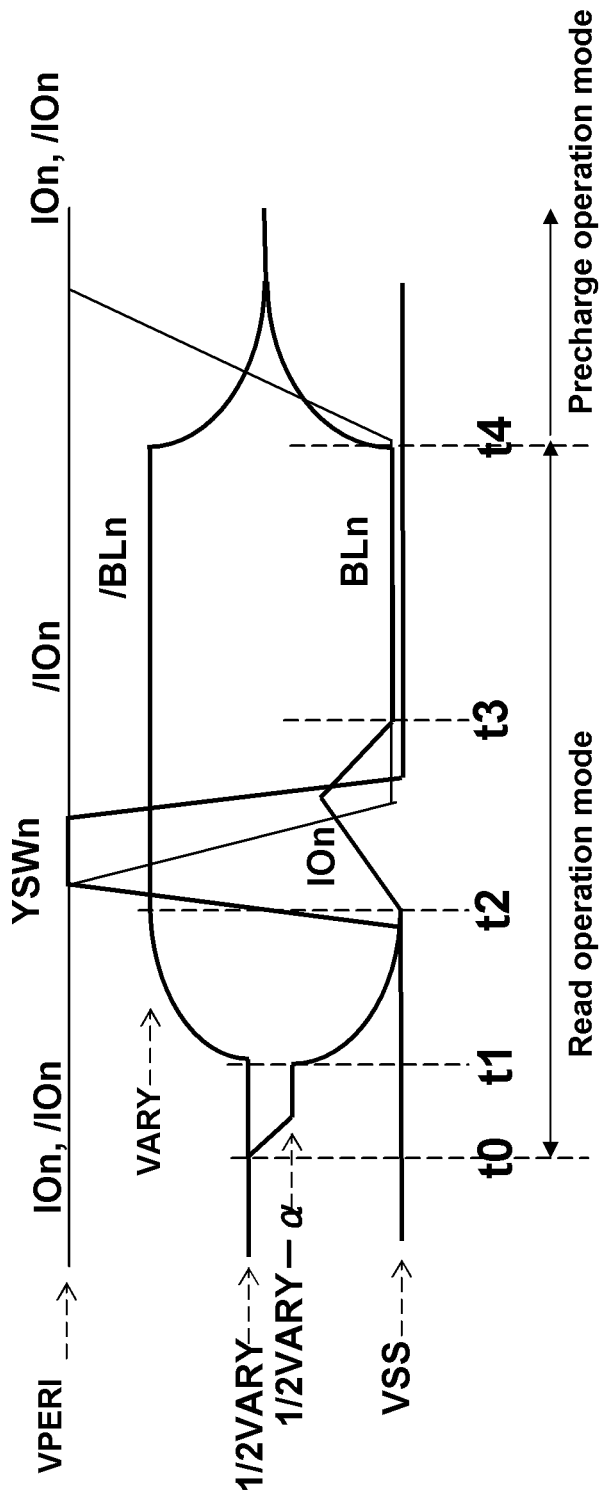
FIG. 10 is a waveform diagram explaining variations of potentials of BLn, /BLn, YSWn, IOn and /IOn at a Read mode and a Precharge mode after the Read mode in an example of the exemplary embodiment.

FIG. 10 is a waveform diagram explaining variations of potentials of BLn, /BLn, YSWn, IOn and /IOn at a Read mode and a Precharge mode after the Read mode in an example of the exemplary embodiment. FIG. 10 is formulated by adding a waveform of IOn and /IOn to FIG. 4, and the operation itself is equivalent with FIG. 4. When YSWn is selected and IOn line and /IOn line are connected to BLn line and /BLn line, respectively, in the Read mode, the potential of /IOn falls down to VSS from VPERI, while the potential of /IOn is maintained at VPERI (from t0 through t4). Thereafter, with the end of Read mode and start of the Precharge mode, the IOn line and /IOn line are supplied with the potential VPERI of the precharge level (after t4).

In the above exemplary embodiment, the description has been given, assuming that among the power supplies provided from the outside, the power supply VSS is fixed, and the power supplies VDD1 and VDD2 that vary in a high voltage direction are given relative to the potential of the power supply VSS. A negative power supply voltage relative to the ground as a reference value may be given to the power supply voltage supplied from the outside. In that case, "rise of the power supply voltage to exceed the predetermined value" may be interpreted as "rise of the absolute value of the power supply voltage to exceed the predetermined value" in the description of the above exemplary embodiments.

In the description of the exemplary embodiment described above, the DRAM has been explained as the preferred exemplary embodiment of the present invention. However, the application range of the present invention is not limited to the DRAM. The present invention is a technique effective for a semiconductor device including an internal voltage operation block and an external voltage operation block, which exchanges a signal between the internal voltage operation block and the external voltage operation block. The internal voltage operation block does not (readily) depend on a power supply voltage supplied from an outside and operates by supply of a constant voltage generated inside the semiconductor device, and the external voltage operation block operates based on the power supply voltage supplied from the outside.

Assume a semiconductor device to which a power supply voltage in a certain voltage range may be usually supplied and which is designed so that an optical operation is performed in the state where the power supply voltage in the certain voltage range is supplied. Then, according to the present invention, even when the power supply voltage exceeding an optimal voltage range is supplied to the semiconductor device, there can be provided the semiconductor device that performs a functionally normal operation without causing a malfunction.

The present invention is particularly effective for a semiconductor device having a structure including a plurality of data holding circuits such as DRAM sense amplifiers in which data held in a selected one of the data holding circuits is read to an external voltage operation block through a selection switch. Each of the data holding circuits includes a first inverter with an input terminal thereof connected to a first node and an output terminal thereof connected to a second node and a second inverter with an input terminal thereof connected to the second node and an output terminal thereof connected to the first node.

The present invention is particularly effective when the selection switch is formed of MOS transistors of a first conductivity type (such as nMOS transistors) alone and precharging is performed in advance for an external voltage operation block at a time of reading data from an internal voltage operation block to the external voltage operation block through the selection switch.

Modifications and adjustments of the exemplary embodiment and the examples are possible within the scope of the overall disclosure (including claims) of the present invention, and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept.

In the present disclosure, the following modes are possible without limitation thereto.

(Mode 1)

A semiconductor device, comprising: an internal circuit; and an internal voltage generation circuit which generates an internal voltage stabilized with respect to a variation of a power supply voltage supplied from outside and supplies the internal voltage to the internal circuit; wherein the internal voltage generation circuit includes an internal voltage control unit which performs control so that when the power supply voltage rises to exceed a predetermined value, operation of stabilizing the internal voltage is stopped to cause the first internal voltage to increase with the rise of the power supply voltage.

(Mode 2)

The semiconductor device according to mode 1, wherein the internal circuit includes: an internal voltage operation block which executes a signal processing operation using the internal voltage as an operating voltage; and an external voltage operation block which is electrically connected to the internal voltage operation block and executes a signal processing operation using the power supply voltage as an operating voltage.

(Mode 3)

The semiconductor device according to mode 1 or 2, wherein the internal voltage generation circuit includes: a reference voltage generation circuit which receives a first control voltage stabilized with respect to variation of the power supply voltage and a second control voltage which varies depending on the variation of the power supply voltage, outputs a reference voltage being proportional to the first control voltage when the first control voltage is equal to or larger than the second control voltage, and outputs a reference voltage being proportional to the second control voltage when the first control voltage is less than the second control voltage; and a comparison circuit which receives the reference voltage and a voltage being proportional to the internal voltage and outputs the internal voltage so that the reference voltage and the voltage being proportional to the internal voltage are equal.

(Mode 4)

The semiconductor device according to mode 3, the reference voltage generation circuit includes a differential amplifier circuit having a differential pair; and the voltage being proportional to the internal voltage is feedback-connected to one of inputs of the differential pair, and the first control voltage and the second control voltage are connected in parallel to the other of inputs of the differential pair.

(Mode 5)

The semiconductor device according to mode 2, wherein the internal operation block includes: a plurality of data holding circuits each formed of two inverters with an output terminal of one of the two inverters connected to an input terminal of the other of the two inverters and an output terminal of the other of the two inverters connected to an input terminal of one of the two inverters; and selection switches between the internal voltage operation block and the external operation block, each switch outputting data in a selected one of the plurality of data holding circuits to a data line; and the external voltage operation block includes: a read amplifier connected to the data line; and a precharge circuit for the data line.

(Mode 6)

The semiconductor device according to mode 5, wherein each of the selection switches is formed of a field effective type transistor of a first conductivity type; and the precharge circuit is formed of field effect type transistors of a conductivity type opposite to the first conductivity type.

(Mode 7)

A semiconductor device, comprising: a plurality of bit lines; a plurality of word lines wired in a direction intersecting the bit lines; a memory cell array with a plurality of memory cells arranged in a matrix form, corresponding to intersections between the bit lines and the word lines; a plurality of sense amplifiers respectively provided corresponding to the bit lines and respectively connected to the corresponding bit lines; column selection switches each of which connects a selected one of the bit lines to a peripheral circuit; and a first internal voltage generation circuit which supplies to each of the sense amplifiers a first internal voltage stabilized with respect to a variation of the power supply voltage; a power supply depending on the power supply voltage supplied from outside being supplied to the column selection switches and the peripheral circuit; the first internal voltage generation circuit including an internal voltage control unit which performs control so that when the power supply voltage varies to exceed a predetermined value, operation of stabilizing the first internal voltage is stopped to cause the first internal voltage to vary following the variation of the power supply voltage.

(Mode 8)

The semiconductor device according to mode 7, wherein the peripheral circuit includes: IO lines connected to the bit lines through the column selection switches; a read amplifier which further amplifies data read from the memory cell array to corresponding ones of the IO lines through a corresponding one of the sense amplifiers and a corresponding one of the column selection switches and outputs the amplified data to the outside; and a precharge circuit for the IO lines.

(Mode 9)

The semiconductor device according to mode 7 or 8, wherein the first internal voltage generation circuit includes: a first reference voltage generation circuit which receives a first control voltage stabilized with respect to the variation of the power supply voltage and a second control voltage which varies depending on the variation of the power supply voltage, outputs a first reference voltage being proportional to the first control voltage when the first control voltage is equal to or larger than the second control voltage, and outputs a first reference voltage being proportional to the second control voltage when the first control voltage is less than the second control voltage; and a comparison circuit which receives the first reference voltage and a voltage being proportional to the first internal voltage and outputs the first internal voltage so that the reference voltage and the voltage being proportional to the first internal voltage are equal.

(Mode 10)

The semiconductor device according to mode 9, wherein the first reference voltage generation circuit includes: a reference voltage generation circuit which outputs a reference voltage stabilized with respect to the variation of the power supply voltage; and a voltage division circuit which voltage-divides the reference voltage to generate the first control voltage; and the internal voltage control unit receives the power supply voltage, and generates the second control voltage having a constant offset with respect to the power supply voltage.

(Mode 11)

The semiconductor device according to any one of modes 7 to 10, further comprising: a second internal voltage generation circuit which generates a second internal voltage higher than the power supply voltage supplied from the outside and stabilized with respect to the variation of the power supply voltage; and a row decoder which receives supply of the second internal voltage from the second internal voltage generation circuit and drives a selected one of the word lines by the second internal voltage; the second internal voltage generation circuit performing control so that an operation of stabilizing the second internal voltage is stopped to cause the second internal voltage to vary following the variation of the power supply voltage, when the first internal voltage generation circuit performs control so that the operation of stabilizing the first internal voltage is stopped to cause the first internal voltage to vary following the power supply voltage.

(Mode 12)

The semiconductor device according to mode 11, wherein the second internal voltage generation circuit includes: a second reference voltage generation circuit which receives a third control voltage stabilized with respect to the variation of the power supply voltage and a fourth control voltage which varies depending on the variation of the power supply voltage, outputs a second reference voltage being proportional to the third control voltage when the third control voltage is equal to or larger than the fourth control voltage, and outputs a second reference voltage being proportional to the fourth control voltage when the third control voltage is less than the fourth control voltage; and a comparison circuit which receives the second reference voltage and a voltage being proportional to the second internal voltage, and outputs the second internal voltage so that the second reference voltage and the voltage being proportional to the second internal voltage are equal.

(Mode 13)

The semiconductor device according to mode 12, wherein the second reference voltage generation circuit outputs a voltage being equal to the third control voltage as the second reference voltage when the third control voltage is equal to or larger than the fourth control voltage, and outputs a voltage being equal to the fourth control voltage as the second reference voltage when the third control voltage is less than the fourth control voltage; and the comparison circuit includes: a voltage division circuit which voltage-divides the second internal voltage; a differential amplifier circuit which receives a voltage obtained by voltage-dividing the second internal voltage by the voltage division circuit and the second reference voltage; an oscillation circuit controlled to oscillate or stop oscillating by an output signal of the differential amplifier circuit; and a charge pump circuit which steps up the power supply voltage supplied from the output according to an output signal of the oscillation circuit, thereby generating the second internal voltage.

(Mode 14)

The semiconductor device according to any one of any modes 7 to 13, further comprising: a third internal voltage generation circuit which performs control so that a third internal voltage stabilized with respect to the variation of the power supply voltage is generated when the first internal voltage stabilized with respect to the variation of the power supply voltage is supplied, and an operation of stabilizing the third internal voltage is stopped to cause the third internal voltage to follow the variation of the power supply voltage when the first internal voltage is controlled to vary following the variation of the power supply voltage; and a bit line precharge circuit which is connected to pairs of the bit lines and operates by supply of the third internal voltage.

(Mode 15)

The semiconductor device according to any one of modes 7 to 14, further comprising: a fourth internal voltage generation circuit which generates a fourth internal voltage stabilized with respect to the variation of the power supply voltage irrespective of whether or not the first internal voltage is controlled to vary following the variation of the power supply voltage.

EXPLANATIONS OF SYMBOLS

16-18: transistors (nMOS transistors constituting a differential pair)
24, 25: transistors (nMOS transistors constituting an offset circuit)
26: transistors (pMOS transistor constituting a sense amplifier)
27: transistors (nMOS transistor constituting a sense amplifier)
29: resistors (resistors constituting a voltage division circuit of an internal voltage control unit)
38: transistors (nMOS transistors constituting bit line precharge circuit)
39: transistors (pMOS transistors constituting IO line precharge circuit)
40: transistor (MOS transistor becoming a power supply switch of a sense amplifier)
41: transistor (nMOS transistor becoming a power supply switch of sense amplifier)
43-1, 43-3, 43-4: power supply transistors (pMOS transistors)
52: power supply transistor (pMOS transistor)
66, 67: transistors (nMOS transistors constituting a selector circuit)
68: transistor (nMOS transistor becoming a power supply of MAX circuit)
69, 70: transistors (pMOS transistors becoming a load circuit of MAX circuit)
71: transistor (pMOS transistor becoming an output transistor of MAX circuit)
72, 73: resistors (resistors constituting an output voltage division circuit of MAX circuit)
74, 75: transistors (nMOS transistors becoming a differential pair of comparison circuit)
76, 77: transistors (pMOS transistors becoming a load circuit of a differential pair of comparison circuit)
82, 83: resistors (resistors constituting an output voltage division circuit of a comparison circuit)
VREF0: reference voltage
VARY: first internal voltage (power supply voltage supplied to sense amplifier)
VARYRN: first control voltage
VARYRS: second control voltage
VARYR: first reference voltage
VPP: second internal voltage (power supply voltage supplied to row decoder)
VVPPRSP: third control voltage
VVPPRSS: fourth control voltage
VPPRSP: second reference voltage
VEQ: third internal voltage (power supply voltage supplied to bit line precharge signal driving circuit)
VDLP: fourth internal voltage (constant power supply voltage supplied to internal circuit(s) other than memory cell array region)

What is claimed is:

1. A semiconductor device comprising:
   an internal circuit; and
   an internal voltage generation circuit stabilizing an internal voltage to be supplied to the internal circuit against a variation of a power voltage supplied to the internal voltage generation circuit;
   wherein the internal voltage generation circuit stops stabilizing the internal voltage when the power voltage is greater than a predetermined value so that the internal circuit is allowed to be supplied with the internal voltage that is subject to the variation of the power voltage,
   wherein the internal voltage generation circuit includes:
   a reference voltage generation circuit configured to generate a first control voltage that is stabilized against the variation of the power voltage and a second control voltage that is varied dependently on the variation of the power voltage; and
   a comparison circuit comparing a feedback voltage related to the internal voltage with the first control voltage to produce the internal voltage stabilized against the variation of the power voltage, the comparison circuit further comparing the feedback voltage with the second control voltage to stop stabilizing the internal voltage.

2. The semiconductor device according to claim 1, wherein said internal circuit includes:
   an internal voltage operation block which executes a signal processing operation using the internal voltage as an operating voltage; and
   an external voltage operation block which is electrically connected to the internal voltage operation block and executes a signal processing operation using the power supply voltage as an operating voltage.

3. The semiconductor device according to claim 2, further comprising:

an external voltage terminal supplied with the power voltage and coupled in common to the internal voltage generation circuit and the external voltage operation block.

4. The semiconductor device according to claim 2, wherein the internal voltage operation block includes:
a memory cell storing data;
a bit line coupled to the memory cell; and
a sense amplifier coupled to the bit line and operating on the internal voltage to amplify a voltage on the bit line up to the internal voltage; and wherein
the external voltage operation block includes:
a data line coupled to the sense amplifier to receive an output of the sense amplifier; and
a precharge circuit coupled to the data line to pre-charge the data line with the power voltage.

5. The semiconductor device according to claim 4, wherein the internal circuit further includes a selection switch provided between the bit line and the data line.

6. A semiconductor device comprising:
a plurality of bit lines:
a plurality of word lines intersecting the bit lines;
a plurality of memory cells arranged respectively at intersections between the bit lines and the word lines;
a plurality of sense amplifiers connected respectively to the bit lines;
a plurality of IO lines;
a plurality of column selection switches provided respectively between the bit lines and the lines;
a column decoder operating on a power voltage supplied from outside to control the column selection switches such that a selected one of the bit lines is connected to corresponding one of the IO lines; and
a first internal voltage generation circuit stabilizing a first internal voltage to be supplied to the sense amplifiers against a variation of the power voltage;
wherein the first internal voltage generation circuit stops stabilizing the first internal voltage when the power voltage is greater than a predetermined value so that the sense amplifiers are allowed to be supplied with the first internal voltage that is subject to the variation of the power voltage,
wherein the first internal voltage generation circuit includes:
a first reference voltage generation circuit configured to generate a first control voltage that is stabilized against the variation of the power voltage and a second control voltage that is varied dependently on the variation of the power voltage; and
a first comparison circuit comparing a first feedback voltage related to the first internal voltage with the first control voltage to produce the first internal voltage stabilized against the variation of the power voltage, the first comparison circuit further comparing the first feedback voltage with the second control voltage to stop stabilizing the internal voltage.

7. The semiconductor device according to claim 6, further comprising:
a read amplifier which further amplifying data read from the memory cells to corresponding ones of the IO lines through a corresponding one of the sense amplifiers and a corresponding one of the column selection switches and outputting the amplified data to the outside; and
a precharge circuit coupled to the data line to pre-charge the IO lines with the power voltage.

8. The semiconductor device according to claim 6, wherein the first reference voltage generation circuit includes:

a reference voltage generation circuit which outputs a reference voltage stabilized against the variation of the power supply voltage; and
a voltage division circuit which voltage-divides the reference voltage to generate the first control voltage; and wherein
the first reference voltage generation circuit receives the power supply voltage, and generates the second control voltage having a constant offset against the power supply voltage.

9. The semiconductor device according to claim 6, further comprising:
a row decoder driving a selected one of the word lines
a second internal voltage generation circuit stabilizing an second internal voltage to be supplied to the row decoder against the variation of the power voltage;
wherein the second internal voltage generation circuit stops stabilizing the second internal voltage when the power voltage is greater than the predetermined value so that the row decoder is allowed to be supplied with the second internal voltage that is subject to the variation of the power voltage.

10. The semiconductor device according to claim 9, wherein
the second internal voltage generation circuit includes:
a second reference voltage generation circuit generates a third control voltage that is stabilized against the variation of the power voltage and a forth control voltage that is varied dependently on the variation of the power voltage; and
a second comparison circuit comparing a second feedback voltage related to the second internal voltage with the third control voltage to produce the second t internal voltage stabilized against the variation of the power voltage, the second comparison circuit further comparing the second feedback voltage with the forth control voltage to stop stabilizing the internal voltage.

11. A device comprising an internal voltage generator generating an internal voltage in repose to a power voltage supplied thereto, the internal voltage being stabilized against a variation of the power voltage in a first range of the power voltage and being allowed to be changed in response to the variation of the power voltage in a second range of the power voltage; the internal voltage generator comprising:
a comparison circuit comparing a feedback voltage related to the internal voltage with a reference voltage to control the internal voltage such that the feedback voltage becomes substantially equal to the reference voltage; and
a reference voltage generation circuit generating a first voltage that is substantially constant and a second voltage that is changed dependently on the variation of the power voltage;
the comparison circuit being configured to employ the first voltage as the reference voltage in the first range of the power voltage and the second voltage as the reference voltage in the second range of the power voltage.

12. The device according to claim 11, wherein the comparison circuit includes a first input terminal supplied with the feedback voltage, a second input terminal supplied with the first voltage, a third input terminal supplied with the second voltage, and an output terminal from which the internal voltage is derived, the second voltage being smaller than the first voltage in the first range of the power voltage and greater than the first voltage in the second range of the power voltage.

13. The device according to claim 11, further comprising a first internal circuit operating on the internal voltage to produce a data signal, and a second internal circuit coupled to the first internal circuit and operating on the power voltage to manipulate the data signal.

14. A device comprising:
a first power terminal supplied with a first power voltage;
a first bit line;
a plurality of memory cells each configured to control, when selected, a potential on the bit line in response to data stored therein;
a sense amplifier supplied with a first internal voltage and configured to operate, when activated, on the first internal voltage to amplify the potential on the bit line;
a first IO line;
a first precharge circuit supplied with a second internal voltage and configured to precharge, when activated, the first IO line to the second internal voltage;
a first switch coupled between the first bit line and the first IO line and configured to from, when turned ON, an electrical path between the first bit line and the first IO line;
a first circuit coupled to the first power terminal to produce the first internal voltage, the first circuit being configured to stabilize the first internal voltage against a variation of the first power voltage and stop, when the first power voltage is greater than a first value, stabilizing the first internal voltage to allow the first internal voltage to follow the variation of the first power voltage; and
a second circuit coupled to the first power terminal to produce the second internal voltage, the second circuit being configured to allow the second internal voltage to follow the variation of the first power voltage not only when the first power voltage is greater than the first value but also when the first circuit stabilizes the first internal voltage against the variation of the first power voltage.

15. The device according to claim 14, wherein the second circuit comprises a second switch couple to the first terminal, the second switch being tuned ON to transfer the first power voltage as the second internal voltage.

16. The device according to claim 15, further comprising a third circuit supplied with the second internal voltage and configured to produce a first control signal supplied to be supplied to the first switch, the first control signal taking the second internal voltage to turn the first switch ON.

17. The device according to claim 16, further comprising a second precharge circuit supplied with a third internal voltage and configured to precharge, when activated, the bit line to the third internal voltage, the third internal voltage being produced from the first internal voltage and taking a level that is smaller than the first internal voltage.

18. The device according to claim 17, further comprising:
a second power terminal supplied with a second power voltage;
a fourth circuit supplied with a fourth internal voltage and configured to produce a second control signal to be supplied to the second precharge circuit, the second control signal taking the fourth internal voltage to activate the second precharge circuit; and
a fifth circuit coupled to the second power terminal to produce the fourth internal voltage.

19. The device according to claim 18, wherein the fifth circuit is configured to stabilize the fourth internal voltage against a variation of the second power voltage and stop, when the second power voltage is greater than a second value, stabilizing the fourth internal voltage to allow the fourth internal voltage to follow the variation of the second power voltage.

20. The device according to claim 18, further comprising:
a plurality of word lines each coupled to an associated one of the memory cells;
a driver circuit supplied with a fifth internal voltage and configured to drive one of the word lines to the fifth internal voltage to select one of the memory cells, the fifth internal voltage being greater than the fourth internal voltage; and
a sixth circuit coupled to the second terminal to produce the fifth internal voltage.

21. The device according to claim 20, wherein the fifth circuit is configured to stabilize the fourth internal voltage against a variation of the second power voltage and stop, when the second power voltage is greater than a second value, stabilizing the fourth internal voltage to allow the fourth internal voltage to follow the variation of the second power voltage, and the sixth circuit is configured to stabilize the fifth internal voltage against the variation of the second power voltage and stop, when the second power voltage is greater than a third value, stabilizing the fifth internal voltage to allow the fifth internal voltage to follow the variation of the second power voltage.

* * * * *